(12) United States Patent
Watanabe

(10) Patent No.: US 9,732,439 B2
(45) Date of Patent: Aug. 15, 2017

(54) METHOD OF FORMING A LAMINATE OF EPITAXIALLY GROWN CUBIC SILICON CARBIDE LAYERS, AND METHOD OF FORMING A SUBSTRATE-ATTACHED LAMINATE OF EPITAXIALLY GROWN CUBIC SILICON CARBIDE LAYERS

(71) Applicant: SEIKO EPSON CORPORATION, Tokyo (JP)

(72) Inventor: Yukimune Watanabe, Hokuto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 26 days.

(21) Appl. No.: 14/737,281

(22) Filed: Jun. 11, 2015

(65) Prior Publication Data

US 2015/0275394 A1 Oct. 1, 2015

Related U.S. Application Data

(62) Division of application No. 13/189,776, filed on Jul. 25, 2011, now abandoned.

(30) Foreign Application Priority Data

Aug. 13, 2010 (JP) ................................. 2010-181206

(51) Int. Cl.
*C03B 25/10* (2006.01)
*C30B 25/10* (2006.01)
(Continued)

(52) U.S. Cl.
CPC .............. *C30B 25/10* (2013.01); *C30B 25/14* (2013.01); *C30B 25/18* (2013.01); *C30B 25/186* (2013.01); *C30B 29/36* (2013.01)

(58) Field of Classification Search
CPC ......... C30B 25/00; C30B 25/02; C30B 25/10; C30B 25/14; C30B 25/16; C30B 25/165;
(Continued)

(56) References Cited

U.S. PATENT DOCUMENTS 4,623,425 A 11/1986 Suzuki et al.
6,821,340 B2 * 11/2004 Nagasawa ............... C30B 25/00
117/102

(Continued)

FOREIGN PATENT DOCUMENTS

JP 2001-335935 A 12/2001
JP 2002-057109 * 2/2002
(Continued)

*Primary Examiner* — Kenneth A Bratland, Jr.
(74) *Attorney, Agent, or Firm* — Oliff PLC

(57) ABSTRACT

A method for manufacturing a cubic silicon carbide film includes: a first step of introducing a carbon-containing gas onto a silicon substrate and rapidly heating the silicon substrate to an epitaxial growth temperature of cubic silicon carbide so as to carbonize a surface of the silicon substrate and form a cubic silicon carbide film; and a second step of introducing a carbon-containing gas and a silicon-containing gas onto the cubic silicon carbide film while maintaining the cubic silicon carbide film at the epitaxial growth temperature of cubic silicon carbide, so as to allow further epitaxial growth of the cubic silicon carbide film.

6 Claims, 6 Drawing Sheets

(51) Int. Cl.
*C30B 25/14* (2006.01)
*C30B 25/18* (2006.01)
*C30B 29/36* (2006.01)

(58) Field of Classification Search
CPC ..... C30B 25/18; C30B 25/183; C30B 25/186; C30B 29/00; C30B 29/10; C30B 29/36; C23C 16/30; C23C 16/32; C23C 16/325; C23C 16/45502; C23C 16/45523; C23C 16/45525; C23C 16/45527
USPC ... 117/84, 88–90, 93–94, 102, 104–106, 951
See application file for complete search history.

(56) References Cited

U.S. PATENT DOCUMENTS

| | | |
|---|---|---|
| 7,416,605 B2 | 8/2008 | Zollner et al. |
| 7,763,529 B2 | 7/2010 | Chen et al. |
| 2002/0019117 A1 | 2/2002 | Nagasawa |
| 2002/0096104 A1* | 7/2002 | Yagi ................. C30B 19/00 117/84 |
| 2004/0266057 A1 | 12/2004 | Nagasawa |

FOREIGN PATENT DOCUMENTS

| | | |
|---|---|---|
| JP | 2002-057109 A | 2/2002 |
| JP | 2002-220299 A | 8/2002 |
| JP | 2009-158702 A | 7/2009 |

* cited by examiner

METHOD OF FORMING A LAMINATE OF EPITAXIALLY GROWN CUBIC SILICON CARBIDE LAYERS, AND METHOD OF FORMING A SUBSTRATE-ATTACHED LAMINATE OF EPITAXIALLY GROWN CUBIC SILICON CARBIDE LAYERS

This is a Continuation of application Ser. No. 13/189,776 filed Jul. 25, 2011, which claims the benefit of Japanese Patent Application No. 2010-181206, filed Aug. 13, 2010. The disclosure of the prior applications is hereby incorporated by reference herein in its entirety.

BACKGROUND

1. Technical Field

The present invention relates to cubic silicon carbide film manufacturing methods, and cubic silicon carbide film-attached substrate manufacturing methods. Specifically, the invention relates to a cubic silicon carbide film manufacturing method that forms a cubic silicon carbide (SiC) film, an expected wide bandgap semiconductor, on a silicon substrate or on a monocrystalline silicon film formed on the substrate, and to a method for manufacturing a cubic silicon carbide film-attached substrate that includes a cubic silicon carbide film formed on a silicon substrate or on a monocrystalline silicon film formed on the substrate.

2. Related Art

Silicon carbide (SiC), a wide bandgap semiconductor having a bandgap of 2.2 eV (300 K) more than twice as large as that of silicon (Si), has generated interest as semiconductor material for power devices, or as material for high-voltage devices.

The crystal forming temperature of silicon carbide (SiC) is higher than that of silicon (Si), and obtaining silicon carbide (SiC) single crystal ingots by a pull method from a liquid phase is not as easy as in silicon. An alternative method, called a sublimation method, is thus used to form silicon carbide (SiC) single crystal ingots. However, it is difficult with the sublimation method to obtain large-diameter silicon carbide (SiC) single crystal ingots that have few crystal defects. This has limited the diameter of the currently available silicon carbide (SiC) substrates in the market to 3 to 4 inches, and has made the price of these products very expensive.

Cubic silicon carbide (3C-SiC), a variation of silicon carbide (SiC), has relatively low crystal forming temperature, and can be epitaxially grown (heteroepitaxy growth) on inexpensive silicon substrates. The heteroepitaxial technique has thus been studied as one way of increasing the diameter of silicon carbide (SiC) substrates.

The cubic silicon carbide has a lattice constant of 4.359 angstroms, about 20% smaller than the lattice constant (5.4307 angstroms) of monocrystalline silicon. This, combined with different coefficients of thermal expansion, makes it very difficult to obtain a high-quality epitaxial film that has few crystal defects.

Further, because the monocrystalline silicon and the cubic silicon carbide have different coefficients of thermal expansion, bending of the silicon substrate generates stress while the substrate is cooled to room temperature after the epitaxial growth of the cubic silicon carbide film. The stress translates into crystal defects in the cubic silicon carbide film. The adverse effect of such stress can be effectively avoided by lowering the epitaxial growth temperature.

Generally, epitaxial growth involves growth in a gas phase (CVD method). In the CVD method, the growth temperature can be lowered, for example, by (1) allowing growth under a high vacuum, or (2) by using a source gas that easily decomposes at low temperatures, or a source gas that has Si—C bonds. A drawback of lowering growth temperature is that it slows the growth rate.

As a countermeasure, a method has been proposed in which silicon source gas and carbon source gas are alternately flowed to enable formation of a cubic silicon carbide (3C-SiC) epitaxial film with few crystal defects at a practical growth rate (see JP-A-2001-335935).

While the method of the foregoing publication enables formation of an epitaxial film with few crystal defects with the alternately flowed silicon source gas and carbon source gas, the epitaxial growth temperature of the cubic silicon carbide (3C-SiC) remains at 1,200° C. to 1,300° C., a temperature range no different from the epitaxial growth temperatures of common cubic silicon carbides (3C-SiC). Thus, the different coefficients of thermal expansion cause stress while cooling the substrate, and the stress translates into crystal defects. It has thus been difficult to reduce the crystal defects of the cubic silicon carbide film.

SUMMARY

An advantage of some aspects of the invention is to provide a cubic silicon carbide film manufacturing method with which a high-quality cubic silicon carbide film with few crystal defects can be grown at high speed, and a cubic silicon carbide film-attached substrate manufacturing method with which a high-quality cubic silicon carbide film with few crystal defects can be grown at high speed on a silicon substrate, or on a monocrystalline silicon film formed on the substrate.

An aspect of the invention is directed to a method for manufacturing a cubic silicon carbide film, the method including: a first step of introducing a carbon-containing gas onto a silicon substrate or onto a monocrystalline silicon film formed on the substrate, and rapidly heating the silicon substrate or the monocrystalline silicon film to an epitaxial growth temperature of cubic silicon carbide so as to carbonize a surface of the silicon substrate or the monocrystalline silicon film and form a cubic silicon carbide film; and a second step of introducing a carbon-containing gas and a silicon-containing gas onto the cubic silicon carbide film while maintaining the cubic silicon carbide film at the epitaxial growth temperature of cubic silicon carbide, so as to allow further epitaxial growth of the cubic silicon carbide film.

According to the cubic silicon carbide film manufacturing method of the aspect of the invention, a carbon-containing gas is introduced onto the silicon substrate or the monocrystalline silicon film, and the silicon substrate surface or the monocrystalline silicon film is rapidly heated to the epitaxial growth temperature of cubic silicon carbide to carbonize the silicon substrate surface or the monocrystalline silicon film with the carbon-containing gas and form a cubic silicon carbide film.

Further, a carbon-containing gas and a silicon-containing gas are introduced onto the cubic silicon carbide film while maintaining the cubic silicon carbide film at the epitaxial growth temperature of the cubic silicon carbide, so as to allow further epitaxial growth of the cubic silicon carbide film.

In this way, a high-quality cubic silicon carbide film with few crystal defects can be formed more quickly than when the cubic silicon carbide film is epitaxially grown at a constant temperature.

A high-quality cubic silicon carbide film with few crystal defects can thus be obtained at high speed.

The cubic silicon carbide film manufacturing method according to the aspect of the invention may further include a third step of forming a monocrystalline silicon film on the cubic silicon carbide film by introducing a silicon-containing gas onto the cubic silicon carbide film epitaxially grown in the second step, with the cubic silicon carbide film being set to an epitaxial growth temperature of monocrystalline silicon, wherein the first step and the second step are sequentially performed after the third step.

In the cubic silicon carbide film manufacturing method of this configuration, the third step is performed that forms a monocrystalline silicon film on the cubic silicon carbide film by introducing a silicon-containing gas onto the cubic silicon carbide film epitaxially grown in the second step, with the cubic silicon carbide film being set to an epitaxial growth temperature of monocrystalline silicon, and the first and second steps are sequentially performed after the third step. Thus, the cubic silicon carbide film can be obtained in a desired thickness as a laminate of epitaxially grown cubic silicon carbide layers. In this way, a high-quality cubic silicon carbide film of a desired thickness with few crystal defects can easily be obtained at high speed.

In the cubic silicon carbide film manufacturing method according to the aspect of the invention, the rapid heating may be performed at a rate of temperature increase of from 5° C./sec to 200° C./sec.

With the rapid heating being performed a rate of temperature increase of from 5° C./sec to 200° C./sec, in the cubic silicon carbide film manufacturing method according to the aspect of the invention, a high-quality cubic silicon carbide film with few crystal defects can be obtained at even higher speed.

In the cubic silicon carbide film manufacturing method according to the aspect of the invention, the carbon-containing gas and the silicon-containing gas may be switched by controlling a flow rate of the carbon-containing gas and a flow rate of the silicon-containing gas.

In the cubic silicon carbide film manufacturing method of this configuration, switching between the carbon-containing gas and the silicon-containing gas can be easily and conveniently performed by controlling the flow rate of the carbon-containing gas and the flow rate of the silicon-containing gas.

In the cubic silicon carbide film manufacturing method according to the aspect of the invention, the carbon-containing gas may contain hydrocarbon gas.

In the cubic silicon carbide film manufacturing method of this configuration, the carbon atoms contained in the carbon-containing gas bind to the silicon atoms in the monocrystalline silicon film to generate a cubic silicon carbide film. In this way, a cubic silicon carbide film can easily be formed on the surface of the silicon substrate.

In the cubic silicon carbide film manufacturing method according to the aspect of the invention, the silicon-containing gas may contain silane gas.

In the cubic silicon carbide film manufacturing method of this configuration, the silicon atoms generated by the decomposition of the silicon-containing gas form a monocrystalline silicon film on the silicon substrate or the monocrystalline silicon film. In this way, the monocrystalline silicon film can easily be formed.

Another aspect of the invention is directed to a method for manufacturing a cubic silicon carbide film-attached substrate that includes a cubic silicon carbide film formed on a silicon substrate or on a monocrystalline silicon film formed on the substrate, the method including: a first step of introducing a carbon-containing gas onto the silicon substrate or the monocrystalline silicon film, and rapidly heating the silicon substrate or the monocrystalline silicon film to an epitaxial growth temperature of cubic silicon carbide so as to carbonize a surface of the silicon substrate or the monocrystalline silicon film and form the cubic silicon carbide film; a second step of introducing a carbon-containing gas and a silicon-containing gas onto the cubic silicon carbide film while maintaining the cubic silicon carbide film at the epitaxial growth temperature of cubic silicon carbide, so as to allow further epitaxial growth of the cubic silicon carbide film.

According to the cubic silicon carbide film-attached substrate manufacturing method of the aspect of the invention, a carbon-containing gas is introduced onto the silicon substrate or the monocrystalline silicon film, and the silicon substrate surface or the monocrystalline silicon film is rapidly heated to the epitaxial growth temperature of cubic silicon carbide to carbonize the silicon substrate surface or the monocrystalline silicon film with the carbon-containing gas and form a cubic silicon carbide film.

Further, a carbon-containing gas and a silicon-containing gas are introduced onto the cubic silicon carbide film while maintaining the cubic silicon carbide film at the epitaxial growth temperature of cubic silicon carbide, so as to allow further epitaxial growth of the cubic silicon carbide film.

In this way, a high-quality cubic silicon carbide film with few crystal defects can be formed more quickly than when the cubic silicon carbide film is epitaxially grown at a constant temperature.

A substrate including such a high-quality cubic silicon carbide film with few crystal defects can thus be obtained at high speed.

The cubic silicon carbide film-attached substrate manufacturing method according to the aspect of the invention may further include a third step of forming a monocrystalline silicon film on the cubic silicon carbide film by introducing a silicon-containing gas onto the cubic silicon carbide film epitaxially grown in the second step, with the cubic silicon carbide film being set to an epitaxial growth temperature of monocrystalline silicon, wherein the first step and the second step are sequentially performed after the third step.

In the cubic silicon carbide film-attached substrate manufacturing method of this configuration, the third step is performed that forms a monocrystalline silicon film on the cubic silicon carbide film by introducing a silicon-containing gas onto the cubic silicon carbide film epitaxially grown in the second step, with the cubic silicon carbide film being set to an epitaxial growth temperature of monocrystalline silicon, and the first and second steps are sequentially performed after the third step. Thus, the cubic silicon carbide film can be obtained in a desired thickness as a laminate of epitaxially grown cubic silicon carbide layers. In this way, a substrate including a high-quality cubic silicon carbide film of a desired thickness with few crystal defects can be obtained at high speed.

BRIEF DESCRIPTION OF THE DRAWINGS

The invention will be described with reference to the accompanying drawings, wherein like numbers reference like elements.

DESCRIPTION OF EXEMPLARY EMBODIMENTS

An embodiment of a cubic silicon carbide film manufacturing method and a cubic silicon carbide film-attached substrate manufacturing method according to the invention is described below.

For ease of explaining the content of the invention, the dimensions including the shapes of the structural components described herein do not necessarily reflect the actual measurements.

Figure 1:
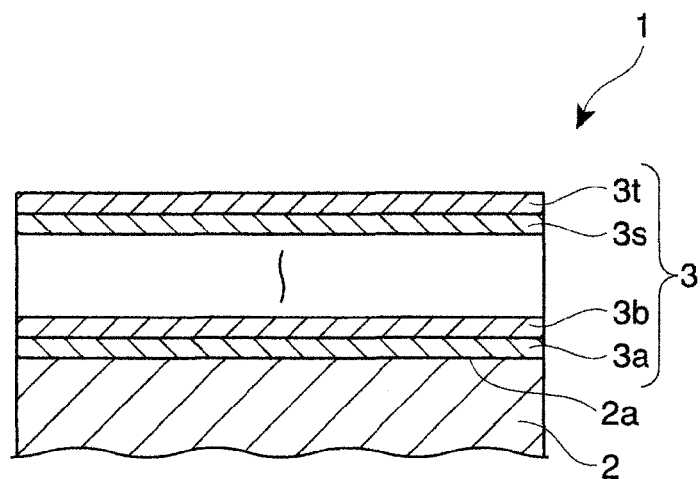
FIG. 1 is a cross sectional view illustrating a cubic silicon carbide film-attached substrate of an embodiment of the invention.

FIG. 1 is a cross sectional view illustrating a cubic silicon carbide film-attached substrate of an embodiment of the invention. As illustrated in the figure, a cubic silicon carbide film-attached substrate 1 includes a cubic silicon carbide (3C-SiC) film 3 as a 20-layer laminate of cubic silicon carbide (3C-SiC) films 3a to 3t formed on a surface 2a of a silicon (Si) substrate 2.

In the cubic silicon carbide film-attached substrate 1, the lamination of the cubic silicon carbide (3C-SiC) films 3a to 3t in 20 layers forms the cubic silicon carbide (3C-SiC) film 3 as a high-quality laminate of a desired thickness with few crystal defects.

A method for manufacturing the cubic silicon carbide film-attached substrate 1 is described below.

First, the silicon substrate 2 is prepared, and housed in the chamber of a heat treatment furnace. After creating a vacuum in the chamber, the silicon substrate 2 is heated to raise the substrate temperature to a predetermined temperature of, for example, 750° C., and heat-treated for a predetermined time period of, for example, 5 minutes to clean the natural oxide film and the like on the surface 2a of the silicon substrate 2.

Then, the temperature of the silicon substrate 2 is set to a temperature of from room temperature to the epitaxial growth temperature T1 of monocrystalline silicon. At temperature T1, the epitaxial growth of the cubic silicon carbide proceeds slowly, and thus the temperature T1 set for the temperature of the silicon substrate 2 can limit the epitaxial growth to only the monocrystalline silicon.

Thereafter, the silicon substrate 2 is rapidly heated to the epitaxial growth temperature T2 of cubic silicon carbide higher than the epitaxial growth temperature T1 of monocrystalline silicon while introducing a carbon source gas (carbon-containing gas) onto the silicon substrate 2.

The carbon source gas is preferably hydrocarbon gas. Preferred examples include methane ($CH_4$), ethane ($C_2H_6$), acetylene ($C_2H_2$), ethylene ($C_2H_4$), propane ($C_3H_8$), n-butane (n-$C_4H_{10}$), isobutane (i-$C_4H_{10}$), and neopentane (neo-$C_5H_{12}$). These may be used either alone or as a mixture of two or more.

The rapid heating is the heating that raises the temperature at a rate of temperature increase that exceeds the reference rate of temperature increase of, for example, 10° C./min. The rate of temperature increase in rapid heating is preferably from 5° C./sec to 200° C./sec.

In rapid heating, a rate of temperature increase below 5° C./sec is too slow, and may cause silicon to sublime from the surface of the silicon substrate 2 and roughen the surface, if the carbon gas supply is small. With a large carbon gas supply, such a slow rate may lead to formation of a thin carbide layer on the surface of the silicon substrate 2, preventing further growth and impairing the growth rate increasing effect. On the other hand, a rate of temperature increase in excess of 200° C./sec in rapid heating makes the heating too rapid, and fails to sufficiently carbonize the surface of the silicon substrate 2, resulting in insufficient silicon carbide generation.

For the introduction of the carbon source gas, only the carbon source gas can be introduced by separately controlling the flow rates of the carbon source gas and the silicon source gas (silicon-containing gas).

In the process of rapid heating, the carbon source gas carbonizes the surface of the silicon substrate 2, and forms a cubic silicon carbide film.

Upon the substrate temperature reaching the cubic silicon carbide epitaxial growth temperature T2, the temperature of the silicon substrate 2 is held at epitaxial growth temperature T2, and the flow rates of the carbon source gas and the silicon source gas are set to the flow rates suitable for the epitaxial growth of cubic silicon carbide.

The silicon source gas is preferably silane gas. Preferred examples include monosilane ($SiH_4$), disilane ($Si_2H_6$), trisilane ($Si_3H_8$), tetrasilane ($Si_4H_{10}$), dichlorosilane ($SiH_2Cl_2$), tetrachlorosilane ($SiCl_4$), trichlorosilane ($SiHCl_3$), and hexachlorodisilane ($Si_2Cl_6$). These may be used either alone or as a mixture of two or more. During this process, the cubic silicon carbide film 3a is formed on the cubic silicon carbide film by the epitaxial growth of cubic silicon carbide.

Thereafter, the supply of the carbon source gas and the silicon source gas is stopped, and the temperature of the silicon substrate 2 is lowered to the epitaxial growth temperature T1 of monocrystalline silicon.

Upon the silicon substrate 2 reaching the monocrystalline silicon epitaxial growth temperature T1, the flow rate of the silicon source gas is set to the flow rate suitable for the epitaxial growth of monocrystalline silicon.

During this process, a monocrystalline silicon film is formed on the cubic silicon carbide film 3*a* by the epitaxial growth of monocrystalline silicon.

The monocrystalline silicon epitaxial growth and the subsequent steps are repeated until the resulting cubic silicon carbide film has a desired thickness.

In this embodiment, the following steps (1) to (4) are repeated.

(1) The step of allowing monocrystalline silicon to epitaxially grow on the cubic silicon carbide film 3*a* while introducing silicon source gas, upon the substrate temperature reaching the monocrystalline silicon epitaxial growth temperature T1.

(2) The step of rapidly heating the substrate to the epitaxial growth temperature T2 of cubic silicon carbide while introducing carbon source gas onto the monocrystalline silicon film formed on the cubic silicon carbide film 3*a*.

(3) The step of allowing the cubic silicon carbide film to epitaxially grow while introducing carbon source gas and silicon source gas at predetermined flow rates, upon the substrate temperature reaching the epitaxial growth temperature T2.

(4) The step of stopping the supply of the carbon source gas and the silicon source gas, and lowering the substrate temperature to the monocrystalline silicon epitaxial growth temperature T1.

By repeating these steps (1) to (4) multiple times, the cubic silicon carbide film-attached substrate 1 can be obtained that has the cubic silicon carbide film 3 of a desired thickness.

For example, by repeating these steps 19 times, the cubic silicon carbide film-attached substrate 1 can be obtained that has the cubic silicon carbide film 3 formed as a 20-layer laminate of the cubic silicon carbide films 3*a* to 3*t*, as illustrated in FIG. 1.

With the cubic silicon carbide film-attached substrate manufacturing method of the present embodiment, the cubic silicon carbide film-attached substrate 1 including the cubic silicon carbide film formed in high quality with few crystal defects can be quickly obtained at a low epitaxial growth temperature after the repeated steps of generating and growing the cubic silicon carbide film, generating a monocrystalline silicon film on the cubic silicon carbide film, and generating and growing the cubic silicon carbide film by the carbonization of the monocrystalline silicon film.

EXAMPLES

The invention is described below in more detail based on Examples. Note, however, that the invention is not limited by the following Examples.

Example 1

Figure 2:
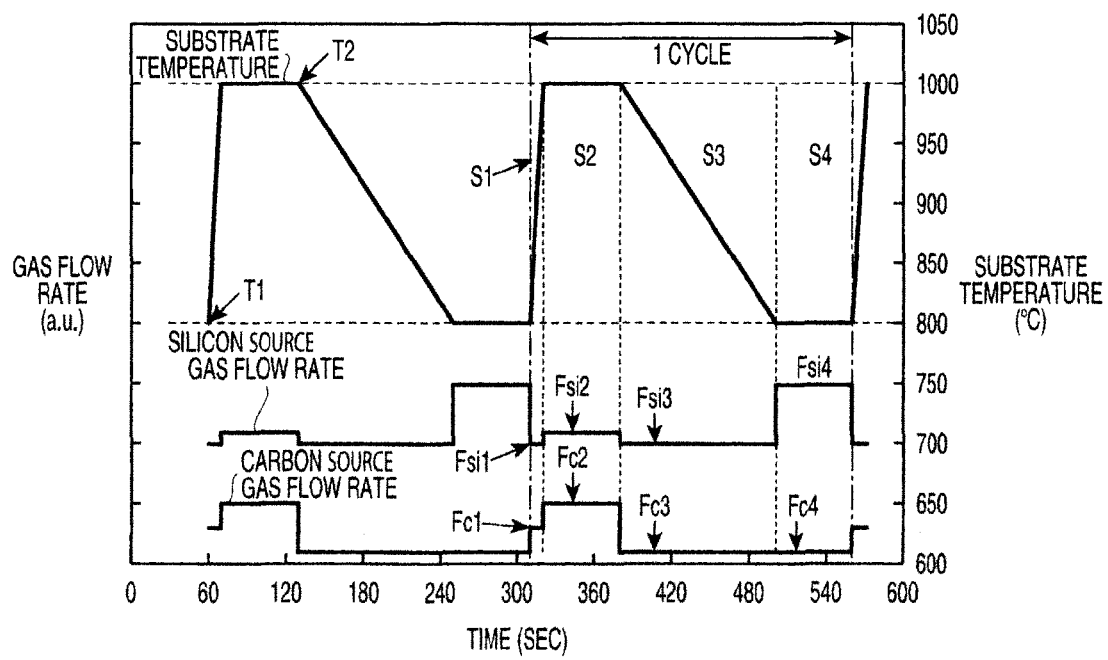
FIG. 2 is a diagram representing the relationship between substrate temperature and the flow rates of carbon source gas and silicon source gas in each section of a temperature cycle of Example 1 of the invention.

FIG. 2 is a diagram representing the relationship between substrate temperature and the flow rates of carbon source gas and silicon source gas in each section of the temperature cycle of Example 1. In this example, neopentane (neo-$C_5H_{12}$) and dichlorosilane ($SiH_2Cl_2$) were used as carbon source gas and silicon source gas, respectively. The monocrystalline silicon epitaxial growth temperature T1 and cubic silicon carbide epitaxial growth temperature T2 were 800° C. and 1,000° C., respectively.

The carbon source gas and the silicon source gas were set to have optimum flow rates Fc1 to Fc4 and Fsi 1 to Fsi 4, respectively, for section S1 (rapid heating carbonization process), section S2 (cubic silicon carbide film epitaxial growth process), section S3 (substrate temperature lowering process), and section S4 (monocrystalline silicon epitaxial growth process).

Here, because only the carbon source gas needs to be introduced in section S1 (rapid heating carbonization process), the carbon source gas flow rate Fc1=3 sccm, and the silicon source gas flow rate Fsi 1=0 sccm.

In section S2 (cubic silicon carbide film epitaxial growth process), both the carbon source gas and the silicon source gas need to be introduced in good balance. Accordingly, the carbon source gas flow rate Fc2=5 sccm, and the silicon source gas flow rate Fsi 2=5 sccm.

Section S3 (substrate temperature lowering process) does not require the supply of carbon source gas and silicon source gas. Accordingly, the carbon source gas flow rate Fc3=0 sccm, and the silicon source gas flow rate Fsi 3=0 sccm.

In section S4 (monocrystalline silicon epitaxial growth process), only the silicon source gas needs to be introduced. Accordingly, the carbon source gas flow rate Fc4=0 sccm, and the silicon source gas flow rate Fsi 4=20 sccm.

By optimally setting the carbon source gas flow rates Fc1, Fc2, Fc3, Fc4, and the silicon source gas flow rates Fsi 1, Fsi 2, Fsi 3, Fsi 4 for sections S1 to S4, a cubic silicon carbide film was quickly obtained in high quality with few crystal defects at a low epitaxial growth temperature.

Example 2

Figure 3:
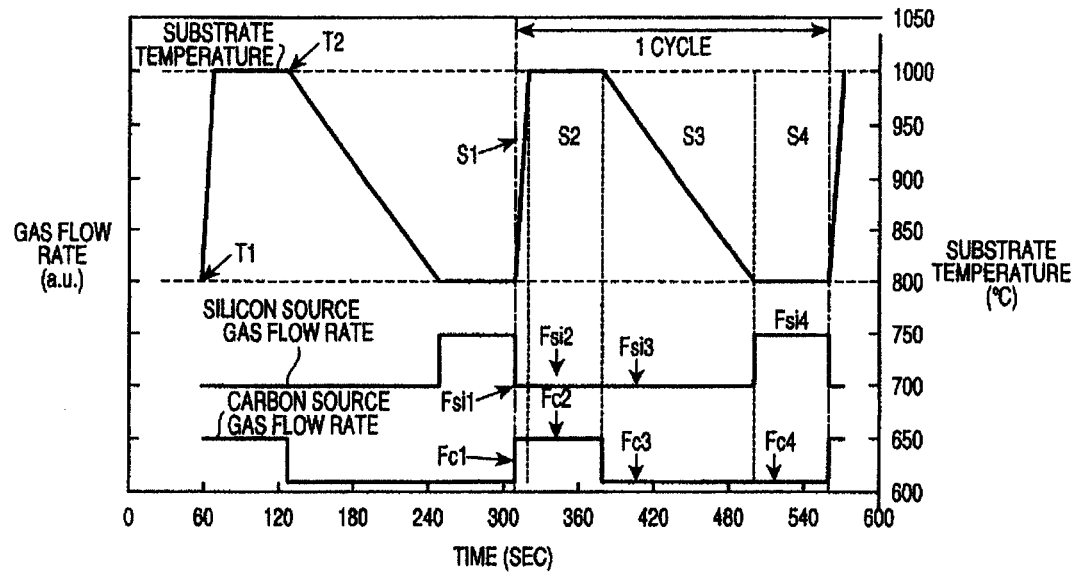
FIG. 3 is a diagram representing the relationship between substrate temperature and the flow rates of carbon source gas and silicon source gas in each section of a temperature cycle of Example 2 of the invention.

FIG. 3 is a diagram representing the relationship between substrate temperature and the flow rates of carbon source gas and silicon source gas in each section of the temperature cycle of Example 2. Example 2 differs from Example 1 in that the carbon source gas flow rate Fc2=3 sccm, and that the silicon source gas flow rate Fsi 2=0 sccm.

In section S2 (cubic silicon carbide film epitaxial growth process), the carbon source gas flow rate Fc2=3 sccm, and the silicon source gas flow rate Fsi 2=0 sccm. This creates an atmosphere with the excess carbon source gas, and promotes carbonization and thus the generation of the cubic silicon carbide film.

Example 3

Figure 4:
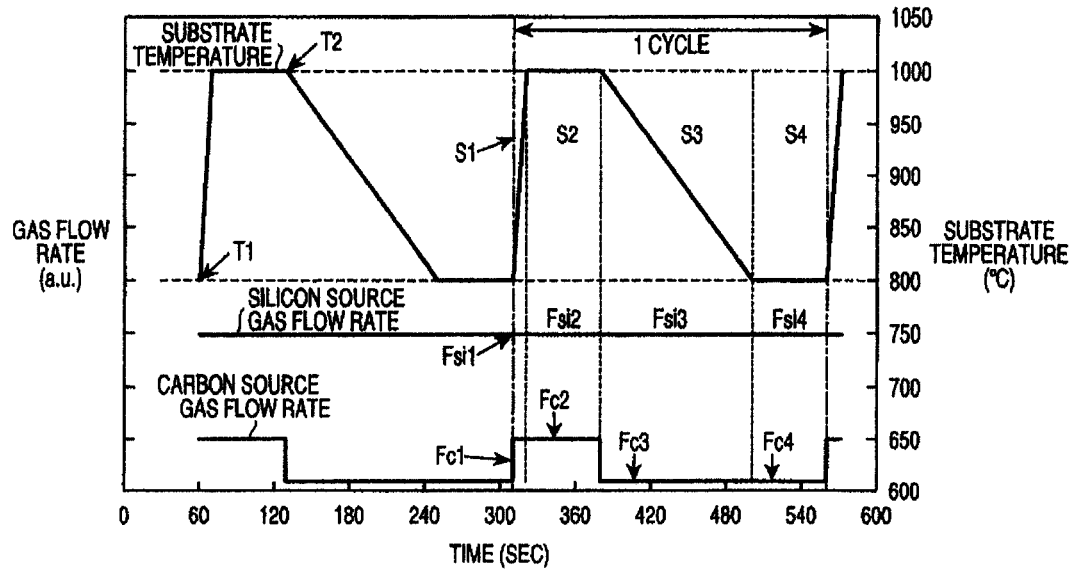
FIG. 4 is a diagram representing the relationship between substrate temperature and the flow rates of carbon source gas and silicon source gas in each section of a temperature cycle of Example 3 of the invention.

FIG. 4 is a diagram representing the relationship between substrate temperature and the flow rates of carbon source gas and silicon source gas in each section of the temperature cycle of Example 3. Example 3 differs from Example 1 in that the carbon source gas flow rate Fc1=Fc2=5 sccm, and Fc3=Fc4=0 sccm, and that the silicon source gas flow rate Fsi 1=Fsi 2=Fsi 3=Fc4=20 sccm.

In section S1 (rapid heating carbonization process), here, both the carbon source gas and the silicon source gas are introduced. However, the introduction of the silicon source gas does not pose any problem, because the effect of carbonization by the carbon source gas far exceeds the growth by the silicon source gas.

Example 4

Figure 5:
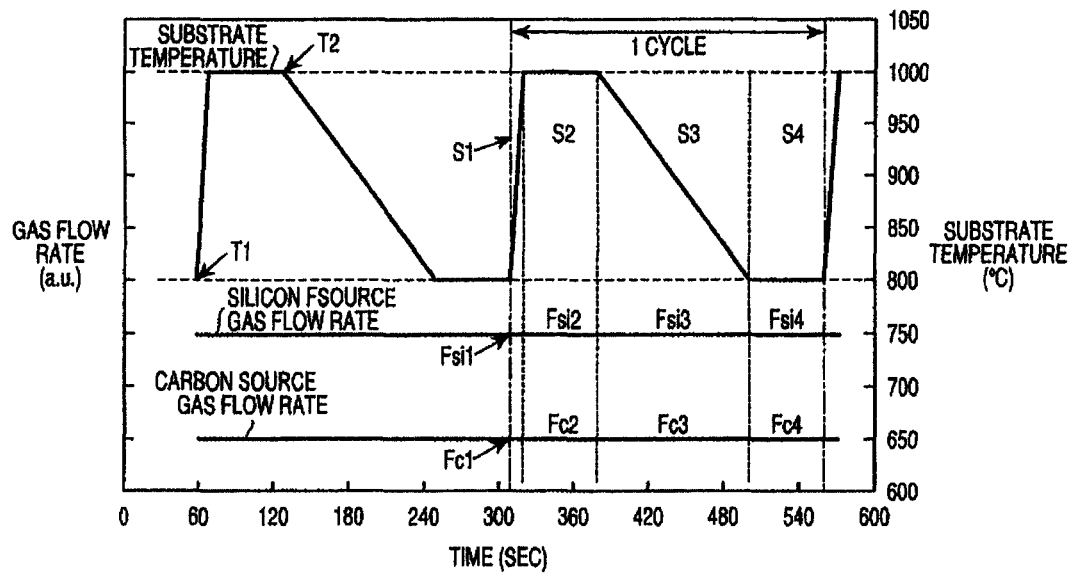
FIG. 5 is a diagram representing the relationship between substrate temperature and the flow rates of carbon source gas and silicon source gas in each section of a temperature cycle of Example 4 of the invention.

FIG. 5 is a diagram representing the relationship between substrate temperature and the flow rates of carbon source gas and silicon source gas in each section of the temperature cycle of Example 4. Example 4 differs from Example 1 in that the carbon source gas flow rate Fc1=Fc2=Fc3=Fc4=5 sccm, and that the silicon source gas flow rate Fsi 1=Fsi 2=Fsi 3=Fc4=20 sccm.

In section S4 (monocrystalline silicon epitaxial growth process), both the carbon source gas and the silicon source gas are introduced. However, the introduction of the carbon source gas and the silicon source gas does not pose any problem, because this temperature range is the silicon epitaxial growth range by the silicon source gas, where there is no epitaxial growth of cubic silicon carbide.

Example 5

Figure 6:
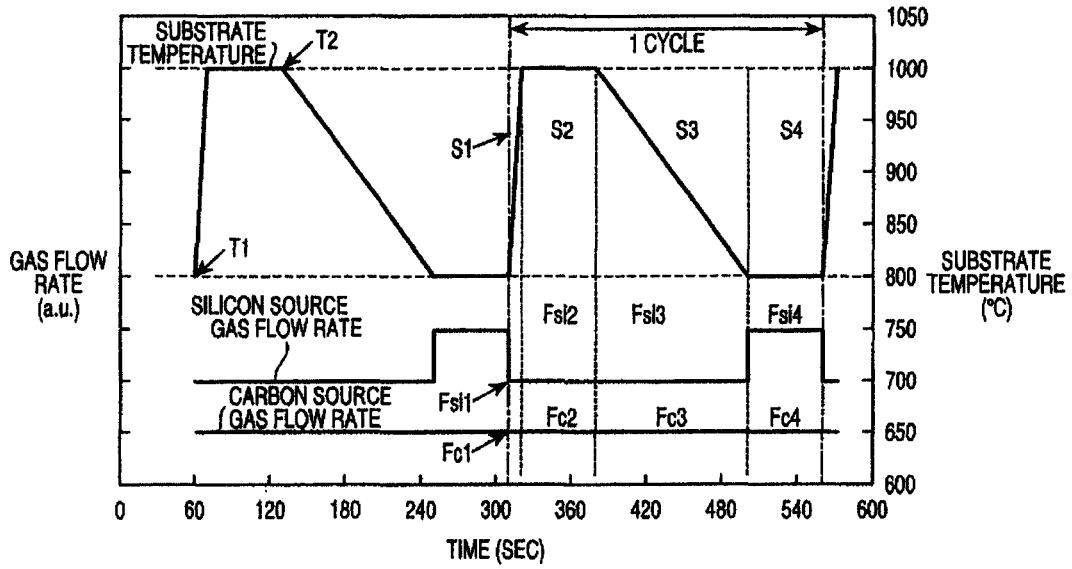
FIG. 6 is a diagram representing the relationship between substrate temperature and the flow rates of carbon source gas and silicon source gas in each section of a temperature cycle of Example 5 of the invention.

FIG. 6 is a diagram representing the relationship between substrate temperature and the flow rates of carbon source gas and silicon source gas in each section of the temperature cycle of Example 5. Example 5 differs from Example 1 in that the carbon source gas flow rate Fc1=Fc2=Fc3=Fc4=5 sccm, and that the silicon source gas flow rate Fsi 1=Fsi 2=Fsi 3=0 sccm, Fc4=20 sccm.

As in Example 4, both the carbon source gas and the silicon source gas are introduced in section S4 (monocrystalline silicon epitaxial growth process). However, the introduction of the carbon source gas and the silicon source gas does not pose any problem, because this temperature range is the silicon epitaxial growth range by the silicon source gas, where there is no epitaxial growth of cubic silicon carbide.

As in Example 1, a cubic silicon carbide film can be quickly obtained in high quality with few crystal defects at a low epitaxial growth temperature also in Examples 2 to 5, by optimally setting the carbon source gas flow rates Fc1, Fc2, Fc3, Fc4, and the silicon source gas flow rates Fsi 1, Fsi 2, Fsi 3, Fsi 4 for each section.

Example 6

Figure 7:
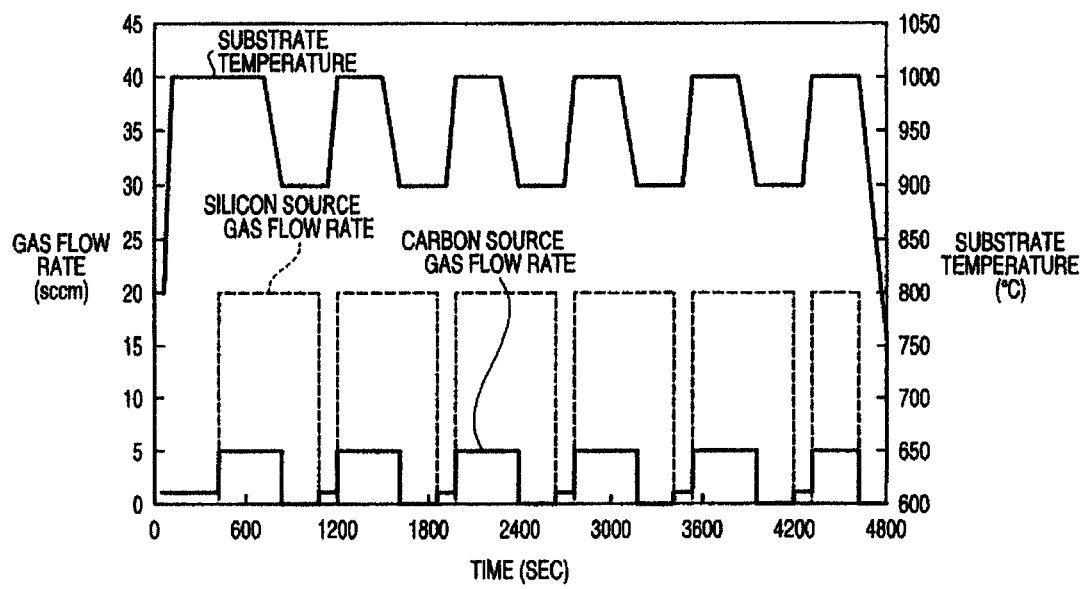
FIG. 7 is a diagram representing the relationship between substrate temperature and the flow rates of carbon source gas and silicon source gas in each section of a temperature cycle of Example 6 of the invention.

FIG. 7 is a diagram representing the relationship between substrate temperature and the flow rates of carbon source gas and silicon source gas in each section of the temperature cycle of Example 6. In this example, neopentane (neo-$C_5H_{12}$) and dichlorosilane ($SiH_2Cl_2$) were used as carbon source gas and silicon source gas, respectively, and 5 cycles of epitaxial growth were performed at the monocrystalline silicon epitaxial growth temperature T1 and cubic silicon carbide epitaxial growth temperature T2 of 900° C. and 1,000° C., respectively.

Section S1 (rapid heating carbonization process), section S2 (cubic silicon carbide film epitaxial growth process), section S3 (substrate temperature lowering process), and section S4 (monocrystalline silicon epitaxial growth process) were set to 60 seconds, 300 seconds, 120 seconds, and 300 seconds, respectively. The flow rates of the carbon source gas were Fc1=1 sccm, Fc2=Fc3=5 sccm, Fc4=0 sccm. The flow rates of the silicon source gas were Fsi 1=0 sccm, Fsi 2=Fsi 3=Fsi 4=20 sccm.

The epitaxial growth was also performed in 10 cycles and in 20 cycles using the same temperature cycle.

Figure 8:
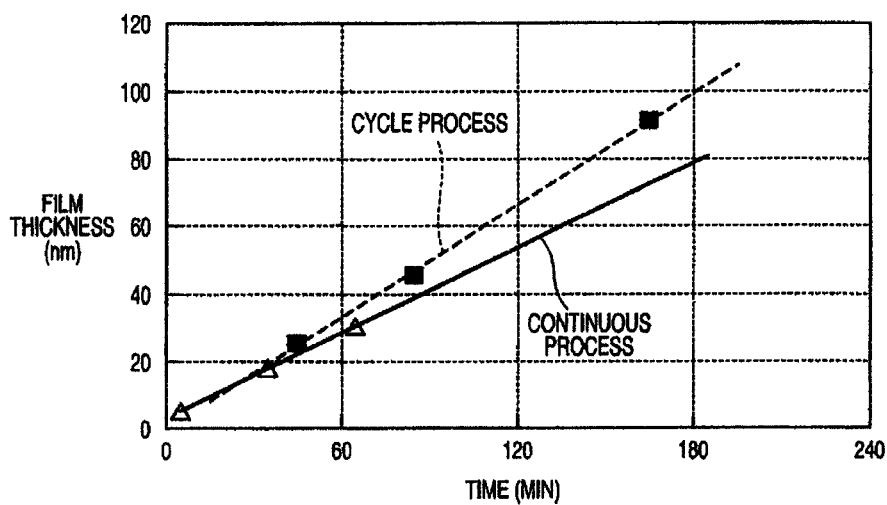
FIG. 8 is a diagram representing the growth time dependence of the thickness of a cubic silicon carbide film formed in Example 6 of the invention, and of the thickness of a cubic silicon carbide film formed by a continuous process.

FIG. 8 is a diagram representing the growth time dependence of the thickness of the cubic silicon carbide film formed by the cycle process of FIG. 7, and of the cubic silicon carbide film formed by a common continuous process that involves epitaxial growth at constant temperature.

The continuous process was performed under the conditions of: substrate temperature=1,000° C.; the flow rate of the carbon source gas (neopentane (neo-$C_5H_{12}$))=5 sccm; and the flow rate of the silicon source gas (dichlorosilane ($SiH_2Cl_2$))=20 sccm.

The cycle process time is represented by the product of the number of cycles and the total growth time in section S1 (rapid heating carbonization process), section S2 (cubic silicon carbide film epitaxial growth process), and section S3 (substrate temperature lowering process).

The growth rate in the cycle process was 33.1 nm/hour, as opposed to 25.1 nm/hour in the continuous process, demonstrating that the growth rate can be increased by performing the cycle process, given the same process conditions.

The increase in growth rate over the continuous process is only slightly higher than 1.3 fold in FIG. 8. This is because the process time was not optimized for each section. The growth rate can be further improved by optimizing the process time of each section.

Example 7

Figure 9:
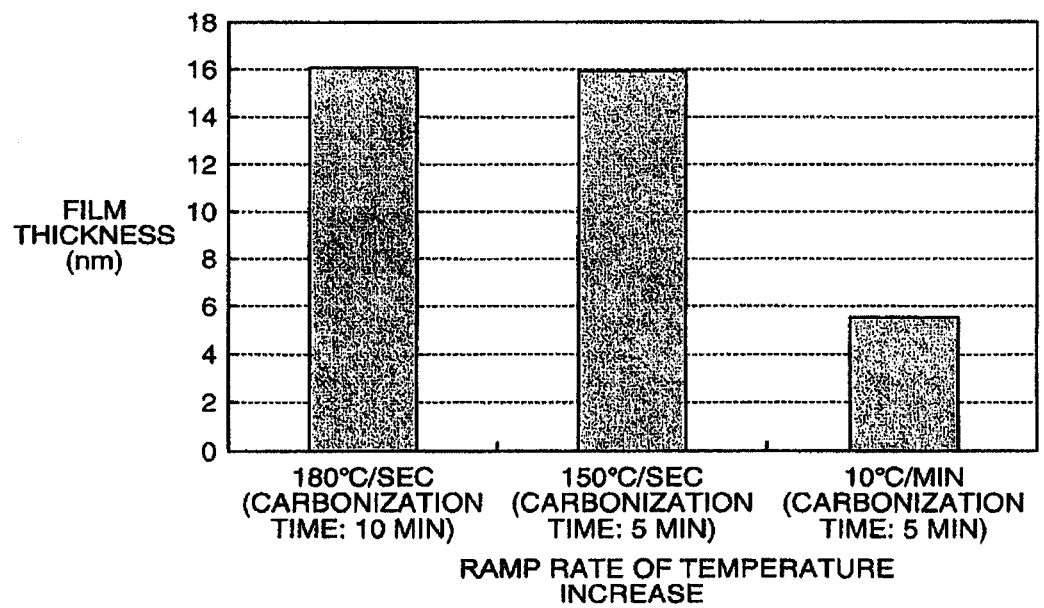
FIG. 9 is a diagram representing the relationship between the rate of temperature increase and the thickness of the cubic silicon carbide film of Example 7 of the invention.

FIG. 9 is a diagram representing the relationship between the rate of temperature increase and the thickness of the cubic silicon carbide film of Example 7. The figure represents the thickness of the cubic silicon carbide film formed after heating the silicon substrate to 600° C., when (1) the substrate was subsequently heated to 1,000° C. at a rate of temperature increase of 180° C./sec, and carbonized at 1,000° C. for 10 minutes while introducing the carbon source gas ethylene ($C_2H_4$) at a flow rate of 3 sccm, (2) the substrate was subsequently heated to 1,000° C. at a rate of temperature increase of 150° C./sec, and carbonized at 1,000° C. for 5 minutes while introducing the ethylene ($C_2H_4$) gas at a flow rate of 10 sccm, and (3) the substrate was subsequently heated to 1,000° C. at a rate of temperature increase of 10° C./sec, and carbonized at 1,000° C. for 5 minutes while introducing the ethylene ($C_2H_4$) gas at a flow rate of 10 sccm.

It can be seen from the figure that the rapid heating to 1,000° C. at the rate of temperature increase of 150° C./sec or more quickly forms a cubic silicon carbide film that is about three times as thick as that formed without rapid heating.

Figure 10:
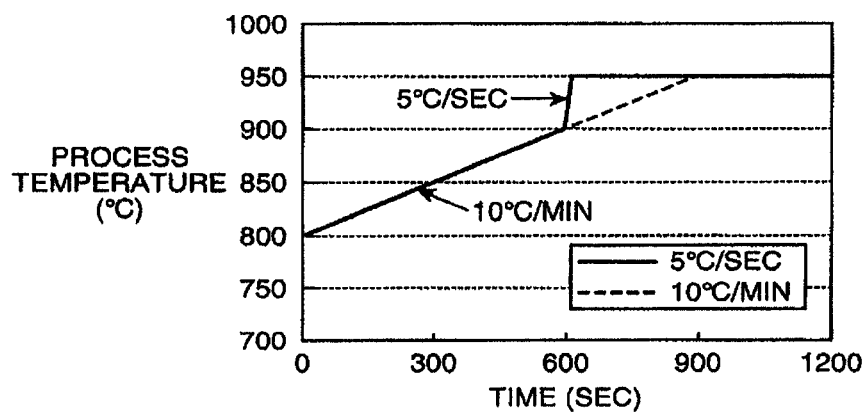
FIG. 10 is a diagram representing changes in substrate temperature with the rate of temperature increase solely varied for the temperature increase of from 900° C. to 950° C.

FIG. 10 is a diagram representing changes in substrate temperature with the rate of temperature increase solely varied for the temperature increase of from 900° C. to 950° C.

In the figure, the solid line indicates temperature changes in carbonization performed by increasing the temperature at a slow rate of temperature increase of 10° C./min until the substrate temperature of 900° C., followed by rapid heating from the substrate temperature of 900° C. to 950° C. at a rate of temperature increase of 5° C./sec.

The broken line indicates temperature changes in the case where the temperature was increased at a slow rate of temperature increase of 10° C./min until the substrate temperature reached 950° C.

Figure 11:
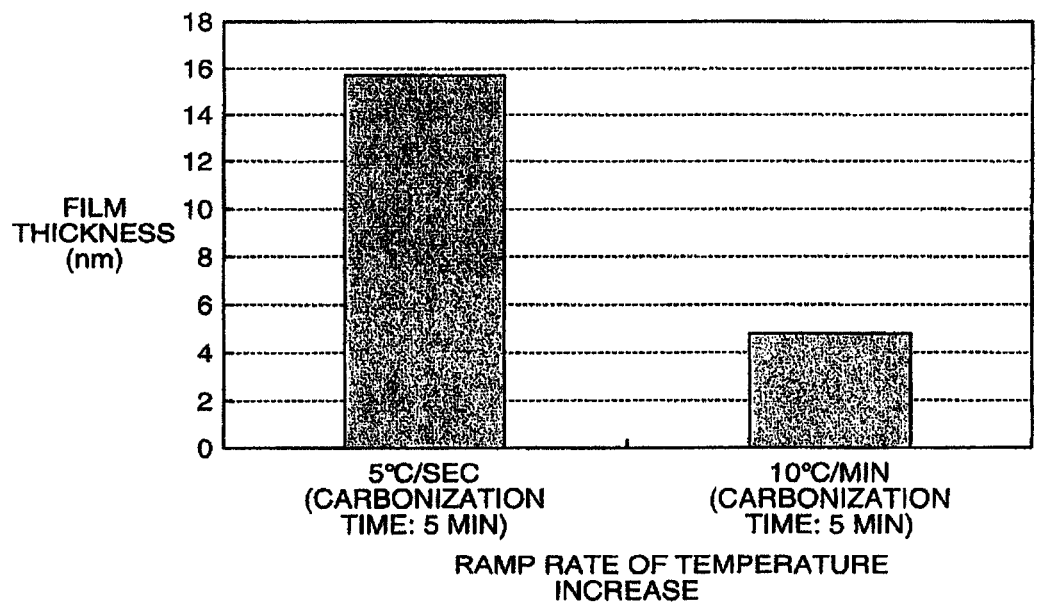
FIG. 11 is a diagram representing the thickness of a carbide layer formed by the rapid heating of a substrate from 900° C. to 950° C., and of a carbide layer formed by low-speed heating.

FIG. 11 represents the thicknesses of carbide layers formed after the carbonization performed at 950° C. for 5 minutes upon the temperature reaching 950° C. along the paths of the solid line and broken line in the presence of the carbon source gas ethylene ($C_2H_4$) flowed at a rate of 10 sccm. It can be seen from the figure that the rapid heating of the substrate from 900° C. to 950° C. promoted the carbonization reaction further compared to the gradual heating, and formed the carbide film in a shorter time period.

At temperatures of 900° C. and lower, there was epitaxial growth of monocrystalline silicon, but substantially no epitaxial growth of the cubic silicon carbide film was observed. Thus, by subjecting the substrate to repeated temperature changes between the monocrystalline silicon epitaxial growth temperature range of 900° C. or less and the rapid heating range of from 900° C. to 950° C., it is possible to alternately perform (1) the epitaxial growth of monocrystalline silicon, and (2) the generation of the cubic silicon carbide film by the carbonization of the monocrystalline silicon, and the epitaxial growth of the cubic silicon carbide film.

The rapid heating allows the cubic silicon carbide film to be formed more quickly than the common process, and thus enables formation of the cubic silicon carbide film at high speed even at relatively low temperatures.

Further, because the cubic silicon carbide film can be formed at low temperature, generation of crystal defects due to the difference in the thermal expansion of the silicon substrate and the cubic silicon carbide film can be suppressed, and a high-quality cubic silicon carbide film with few crystal defects can be formed.

The cubic silicon carbide film-attached substrate 1 of the present embodiment is configured to include the cubic silicon carbide film 3 formed as a 20-layer laminate of the cubic silicon carbide films 3*a* to 3*t* on the surface 2*a* of the silicon substrate 2. However, the number of the laminated layers in the cubic silicon carbide film may be decided according to the required characteristics.

Further, the invention is equally effective when the silicon substrate 2 is replaced with a substrate that includes a monocrystalline silicon film formed on the substrate surface. In this case, the monocrystalline silicon film needs to be sufficiently thick to allow carbonization by rapid heating. The monocrystalline silicon carbide film-attached substrate 1 also can be used as semiconductor material for the next generation of low-loss power devices.

What is claimed is:

1. A method for manufacturing a cubic silicon carbide film, the method comprising:
    a first step of forming the cubic silicon carbide film,
        wherein the first step comprises:
            introducing a carbon-containing gas onto a silicon substrate or onto a monocrystalline silicon film on a substrate, and
            rapidly heating the silicon substrate or the monocrystalline silicon film to an epitaxial growth temperature of cubic silicon carbide so as to carbonize a surface of the silicon substrate or the monocrystalline silicon film;
    a second step of further forming the cubic silicon carbide film,
        wherein the second step comprises:
            introducing a carbon-containing gas and a silicon-containing gas onto the cubic silicon carbide film while maintaining the cubic silicon carbide film at the epitaxial grown temperature of cubic silicon carbide so as to allow further epitaxial growth of the cubic silicon carbide film;
    a third step of stopping the supply of the carbon source gas and the silicon source gas, and lowering the substrate temperature to an epitaxial growth temperature of monocrystalline silicon, and
    a fourth step for forming a monocrystalline silicon film on the cubic silicon carbide film, the fourth step being executed after the third step, and the fourth step comprises:
        introducing a silicon-containing gas onto the cubic silicon carbide film,
    wherein
    the rapid heating is performed at a rate of temperature increase of from 5° C./sec to 200° C./sec.

2. The method according to claim 1, wherein the method further comprises:
    performing the first step and the second step sequentially after the fourth step.

3. The method according to claim 1, wherein
    the carbon-containing gas and the silicon-containing gas are switched by controlling a flow rate of the carbon-containing gas and a flow rate of the silicon-containing gas.

4. The method according to claim 1, wherein the carbon-containing gas contains hydrocarbon gas.

5. The method according to claim 1, wherein the silicon-containing gas contains silane gas.

6. A power device comprising a cubic silicon carbide film obtained by the method according to claim 1.

\* \* \* \* \*